(12) United States Patent
Correale, Jr. et al.

(10) Patent No.: US 7,017,094 B2
(45) Date of Patent: Mar. 21, 2006

(54) PERFORMANCE BUILT-IN SELF TEST SYSTEM FOR A DEVICE AND A METHOD OF USE

(75) Inventors: Anthony Correale, Jr., Raleigh, NC (US); Waleed K. Al-Assadi, Apex, NC (US); Les Mark DeBruyne, Cary, NC (US); Thomas Anderson Dick, Raleigh, NC (US); Jay Donnelly Grollimund, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 10/304,246

(22) Filed: Nov. 26, 2002

(65) Prior Publication Data

US 2004/0103355 A1 May 27, 2004

(51) Int. Cl.
*G01R 31/28* (2006.01)
(52) U.S. Cl. ............................ 714/733; 714/724
(58) Field of Classification Search ................ 714/733, 714/724, 699, 25, 30, 33, 718
See application file for complete search history.

(56) References Cited

U.S. PATENT DOCUMENTS

| | | | | |
|---|---|---|---|---|
| 5,286,656 A | | 2/1994 | Keown et al. ................ 437/7 |
| 5,287,202 A | * | 2/1994 | Kumarappan ............... 358/440 |
| 5,583,875 A | | 12/1996 | Weiss ........................... 371/28 |
| 5,710,911 A | * | 1/1998 | Walsh et al. ................. 713/500 |
| 5,796,751 A | | 8/1998 | Kundu .......................... 371/223 |
| 5,913,228 A | * | 6/1999 | Bedarida ...................... 711/170 |
| 5,996,097 A | * | 11/1999 | Evans et al. ................. 714/719 |
| 6,031,391 A | * | 2/2000 | Couts-Martin et al. ....... 326/38 |
| 6,133,582 A | | 10/2000 | Osann, Jr. et al. ............ 257/48 |
| 6,185,712 B1 | | 2/2001 | Kirihata et al. .............. 714/732 |
| 6,351,837 B1 | | 2/2002 | Huang et al. ................ 714/733 |
| 6,359,818 B1 | * | 3/2002 | Suzuki ........................ 365/201 |

(Continued)

FOREIGN PATENT DOCUMENTS

JP          61241939          10/1986

(Continued)

OTHER PUBLICATIONS

T. K. Jaber and K. Shah, "Built-In Self-Test Technique for Speed Sorting of VLSI Chips," *IBM Technical Disclosure Bulletin*, vol. 32, No 8B, Jan. 1990.

*Primary Examiner*—Albert Decady
*Assistant Examiner*—Dipakkumar Gandhi
(74) *Attorney, Agent, or Firm*—Sawyer Law Group LLP

(57) ABSTRACT

A semiconductor device is disclosed that include a built-in self test system. The device comprises a logic function and a self test engine coupled and integrated with the logic device. The device includes a performance code storage coupled and integrated with the logic function. The performance code storage contains at least one critical path pattern that will be run on the logic function to determine the performance of the logic function when the self test engine causes the logic function to be in a performance test mode. In summary, a performance sort/validate integrated custom logic device, like a microprocessor core can be tested without the need for a separate, high-performance tester. A performance built-in self test (PBIST) approach provides a basic test procedure to be utilized within the device. An integrated memory array, such as the L1-cache, is provided wherein a select set of SRAM memory words are preconditioned at the time of manufacture to contain predefined functional patterns.

28 Claims, 5 Drawing Sheets

U.S. PATENT DOCUMENTS

| | | | |
|---|---|---|---|
| 6,365,859 B1 | 4/2002 | Yi et al. | 209/573 |
| 6,370,676 B1 | 4/2002 | Hayashi et al. | 716/6 |
| 6,496,952 B1 * | 12/2002 | Osada et al. | 714/733 |
| 6,622,269 B1 * | 9/2003 | Ngo et al. | 714/718 |
| 2002/0199142 A1 * | 12/2002 | Gefen | 714/724 |
| 2003/0053358 A1 * | 3/2003 | Kundu et al. | 365/201 |
| 2003/0084389 A1 * | 5/2003 | Kottapalli et al. | 714/733 |

FOREIGN PATENT DOCUMENTS

| | | |
|---|---|---|
| JP | 3138956 | 6/1991 |
| JP | 2001110867 | 4/2001 |

* cited by examiner

PERFORMANCE BUILT-IN SELF TEST SYSTEM FOR A DEVICE AND A METHOD OF USE

FIELD OF THE INVENTION

The present invention relates generally to testing systems and more particularly to a performance built-in self test (PBIST) system used for semiconductor devices.

BACKGROUND OF THE INVENTION

Testing for determining the functional speed of a semiconductor device is becoming more and more challenging. Testers are typically very expensive and have difficulty applying test patterns at the high speeds that the devices under test (DUT) require, especially at the wafer.

Generally, a very significant price premium can often be placed on a device that can operate at the highest performance levels. Hence, the concept of performance sorting is employed. To enable the most revenue from a single device, a sort strategy is employed wherein a product is classified into multiple performance categories. The highest revenue is obtained when all of the devices are properly categorized. To do this, the sort approach requires precision. A device that is capable of the highest performance, but is however down-binned due to inaccurate test sorting, results in lower revenue and profit. A product that is inadvertently up-binned due to inaccurate test sorting results in customer rejection of the part and field return related expenses that can wipe out all revenue gains and customer confidence.

Designers and test engineers have implemented a number of approaches to help mitigate these issues. One such approach is to use an on-device wafer monitor or performance sort ring oscillator (PSRO) that is used to identify the relative performance of a part. This approach requires that a PSRO frequency be determined and then correlated back to the real operational frequency of the device. PSROs have limited global device wiring; they do not track the performance effects of the back end of the line (BEOL) structures, which are becoming more pronounced with smaller lithographies. PSROs are also typically composed of a single type of circuit, and as such, they do not reflect the types of circuits that make up the performance critical paths. This approach requires that significant performance guard-banding be applied, that is, providing a significant amount of tolerance for each performance level of a device, thereby reducing effective revenue.

Another approach is to use the on-device scan chains, which daisy chain all the latches together within a device as a monitor of the real performance of the device. The daisy chains include some level of global device wiring, but this method too lacks the true representative circuits and routing that define the performance critical path, as it does not have any component of combinatorial or custom logic comprising the design. This approach also requires significant amount of guard-banding.

Another example of a means to detect the performance limited paths is to attempt to duplicate the path on device and design logic to allow this path to be exercised by applying a simple pattern(s) to exercise it. This is far more effective than the above-identified testing system, but it requires a predetermination of what will ultimately be the critical path, as well as its physical realization. This also requires additional logic to be added to duplicate the critical path. This path may contain large macros and memory elements that could make reproducing this path complex and require a substantial amount of logic systems for hardware circuits. For example, U.S. Pat. No. 6,185,712, issued on Feb. 6, 2001, entitled Device Performance Optimization with Self Programmed Built-in Self Test, describes in its abstract:

An integrated circuit (IC) device wherein a built-in self test determines the IC s optimum electrical performance. A corresponding optimum performance setting is stored in NVRAM on the device. Upon each device power-up, the optimum performance setting is retrieved and provided to device control which sets the device for its best performance.

This patent automatically generates a test sequence by utilizing a state machine to write and read an assortment of zeros and ones patterned like a checkerboard. This approach can work effectively for memories, wherein an algorithm can be specified to automatically generate the test stimulus, but it may not provide a specific and accurate indication of performance measurement for logic and microprocessors. This patent uses sense amplifiers to determine the performance of this memory specific device.

In another example,

U.S. Pat. No. 5,583,875 issued on Dec. 10, 1996, entitled Automatic Parametric Self-Testing and Grading of a Hardware System describes in its Abstract:

Automatic parametric testing of a system can be achieved by varying a parameter such as speed, voltage, and/or temperature, and then monitoring system performance. Such testing can be used to determine whether a given system meets specifications and performance variations from system to system.

The concept of using a PLL, integrated or otherwise, with an automatic increment/decrement feature to assess performance is the main teaching of this patent. This patent also teaches a test process or procedure for employing the adjustable PLL for speed assessment and states that the result can be stored within the state of some non-volatile device. However, there is no teaching in this patent as to how performance characteristics are obtained and what performance characteristics are important.

What is needed, therefore, is an integrated self test system that will allow for testing over a wide range of devices and performance characteristics. The present invention addresses such a need.

SUMMARY OF THE INVENTION

A semiconductor device is disclosed that includes a performance centric built-in self test system. The device comprises a logic function and a self test engine coupled and integrated with the logic device. The device includes a performance code storage coupled and integrated with the logic function. The performance code storage contains at least one critical path pattern that will be run on the logic function to determine the performance of the logic function when the self test engine causes the logic function to be in a performance test mode.

In summary, a performance sort/validate integrated custom logic device like a microprocessor core can be tested without the need for a separate, high-performance tester. A performance built-in self test (PBIST) approach provides a basic test procedure to be utilized within the device. An integrated memory array, such as the L1-cache, is provided wherein a select set of SRAM memory words are preconditioned at the time of manufacture to contain predefined functional patterns.

DETAILED DESCRIPTION

The present invention relates generally to testing systems and more particularly to a performance built-in self test (PBIST) system used for semiconductor devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The Performance Built-In Self Test System (PBIST)

A self-contained performance analysis system that can be used for speed binning of devices during manufacture is disclosed. The only interaction required from outside of the device under test is to start the test and to read out the result of the test to allow the device to be placed into the proper bin. For a more particular description of this system, refer now to the following paragraphs in conjunction with the accompanying figures.

Figure 1:
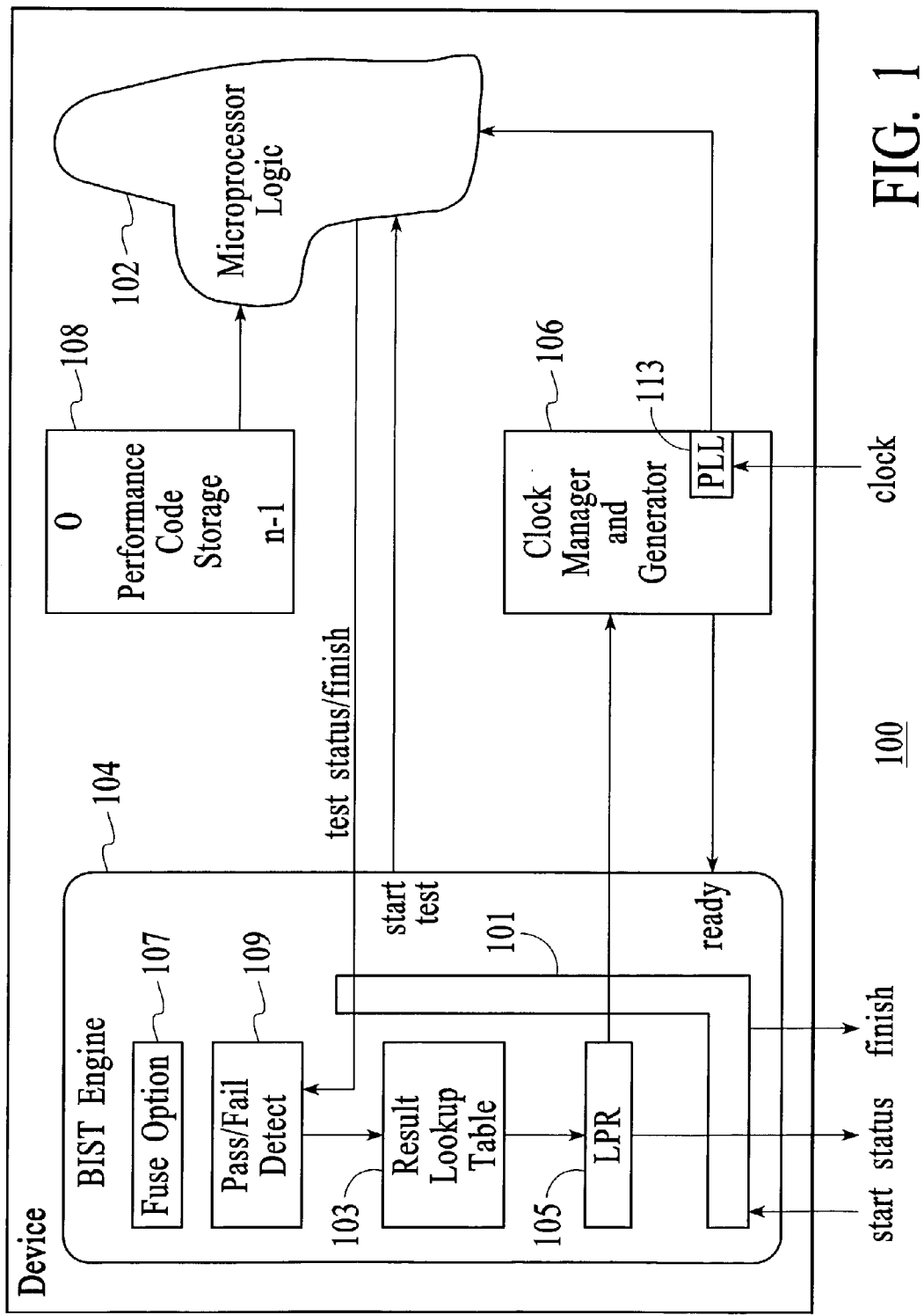
FIG. 1 illustrates a performance sorting self test implementation of a microprocessor core or device.

FIG. 1 illustrates a performance built-in self test (PBIST) system 100 in accordance with the present invention. The PBIST system 100 includes a microprocessor logic 102 and a built-in self test (BIST) engine 104 coupled to the microprocessor logic 102. The PBIST system also includes a clock manager and generator (CMG) 106 coupled to microprocessor logic 102 and the BIST engine 104. Finally, the PBIST system includes a performance code storage 108 coupled to microprocessor logic 102.

The PBIST system 100 does not need sophisticated testing equipment, can be designed to communicate with any type of interface, and can be easily moved between different test environments without modification. The interface to the outside can be designed as a custom interface for a specific test environment or use any of the standard I/O interfaces that are a functional part of the device being tested such as a JTAG controller.

The functionality of each of the elements of the PBIST system 100 and their interaction is described herein below.

Microprocessor Logic 102

The microprocessor logic 102 is the block of logic for which the speed-sort is being established. It is desired to determine the fastest speed at which the microprocessor logic 102 can maintain its correct operation and bin faster parts to sell at a premium.

BIST Engine 104

The built-in self test (BIST) engine 104 is the general test controller. The BIST engine 104 contains all the logic needed to support the critical path testing. The BIST engine 104 includes the following functions:

(a) The interface and control 101 is for reporting the test start, finish, and results. This interface 101 includes logic to communicate with the test platform external to the device, to enable the test mode on device, and to start and end tests.

(b) Pass/fail detection logic 109. The pass/fail detection logic 109 operates in combination with the microprocessor logic 102 to determine if a test has passed or failed. The microprocessor logic 102 may have built-in functions that allow it to check results or to format and store results in a specific manner that allows the BIST engine 104 to analyze the results for pass/fail and take appropriate action. The BIST engine 104 itself may be required to monitor the microprocessor logic 102 and perform result checks.

(c) Result Lookup Table (RLT) 103 to track the current test state, sequence to the next required test, and issue timing configurations to the CMG 106.

(d) A last pass register (LPR) 105 to save the timing conditions in terms of the fastest operational frequency allowed for reporting results back to the external test environment.

(e) A fuse option 107 allows the user to hard code into the device at the time of testing the performance grade that the device will support so that it can later be identified by speed.

Clock Manager and Generator 106

The clock manager and generator 106 is a programmable clock controller that supplies the required clock frequencies to test the microprocessor logic. The BIST engine 104 provides requested clock frequency and the clock manager and generator 106 configures itself appropriately and signals the BIST engine 104 when its clock outputs have stabilized.

Performance Code Storage 108

The performance code storage block 108 contains the critical path pattern or patterns that will be run on the microprocessor logic 102 to determine its maximum performance. These critical path patterns are defined to sensitize critical logic paths in the microprocessor logic 102. The critical path patterns are defined with the following criteria:

(a) Stimulate the longest reported paths possible. It is often difficult to stimulate the exact path reported by timing analysis. It is sufficient to stimulate paths close to the critical path and then scale the results to the longest path reported.

(b) Stimulate paths that will produce deterministic failure signatures. When tests are run on hardware there should be no question of when a failure occurs and that the failure was caused by sensitizing the desired path.

(c) The test should be designed to provide as large a window as possible between the targeted path failing and other paths failing. This increases the ease in which the deterministic failure signature can be seen.

(d) Paths should be contained entirely internal to microprocessor logic under test so they can be easily ported to other devices or test environments containing the microprocessor logic without knowledge of the logic outside of what is targeted by the test.

(e) Critical path patterns can be tailored to the needs of the user and to allow general application in many environments. Accordingly, a complex test environment is not needed.

Basic Test Process

In a preferred embodiment, the basic test process utilizing the PBIST system 100 would proceed as follows.

First, the BIST engine 104 receives a start signal. The BIST engine 104 provides the initial setting to the clock manager and generator 106 to configure the PLL 113 within the clock manager and generator 106 to output the initial clock frequency. Next, the clock manager and generator 106 signals the BIST engine 104 that its clock outputs have stabilized. The BIST engine 104 then signals the microprocessor logic 102 that it is in performance test mode and that it should begin testing. The microprocessor logic 102 then begins executing the critical path test from the performance code storage 108. The critical path code will exercise the targeted critical path.

Finally, test completion and status is determined through a combination of self-checking features of the microprocessor logic 102 and a failure detection process performed by the BIST engine 104. The test completion and status provides a performance sorting process, that is, sorting the device appropriately based upon performance, and provides a store and record process, that is, the performance of the device is stored and recorded. The functions of the test and completion status are described below.

Sorting Process

The sorting process is as follows.

First, a bit is set in the result look up table (RLT) 103 indicating that the sorting process is initiated. The RLT 103 sends a timing configuration to the CMG 106. The BIST engine 104 then requests the clock manager and generator (CMG) 106 be configured and start running. Once the PLL is stable, the CMG 106 indicates a ready condition. The ready condition is passed back to the BIST engine 104 which then issues another start test to the microprocessor logic 102. Test results are passed to the RLT 103 from the Pass/Fail detection logic 109. The RLT 103 is updated with the state of the test. This process continues until BIST engine 104 detects that a fail condition is returned from microprocessor logic 102. After the fail condition is returned, then the store-and-record process is initiated.

Store-and-Record Process

In this process, first testing halts when the BIST engine 104 detects a fail condition from the microprocessor logic 102. The LPR 105 is written from the RLT 103 to store and report the last passing value of the test. Finally, the performance attribute/bin of the device is permanently recorded within the device using the fuse option 107.

Performance Code Storage Options

One of the key elements of the PBIST system 100 is the performance code storage 108. There are various ways to implement this function. Ideally this memory element or array is an integrated part of the microprocessor logic 102, but it may be external to it. The actual configuration of the performance code storage 108 can be any desired memory from which the microprocessor logic 102 can execute the critical path pattern. The configuration should be chosen so that the performance code storage 108 does not impact the performance of the microprocessor logic 102. For example, consider a microprocessor with a single level of cache. The following figures illustrate three options for locating the performance code storage 108. The cache is shown as a separate block for purposes of illustrating the memory structure, but should be considered an integral part of the microprocessor logic 102 as well as the performance code storage 108.

Option 1

Figure 2:
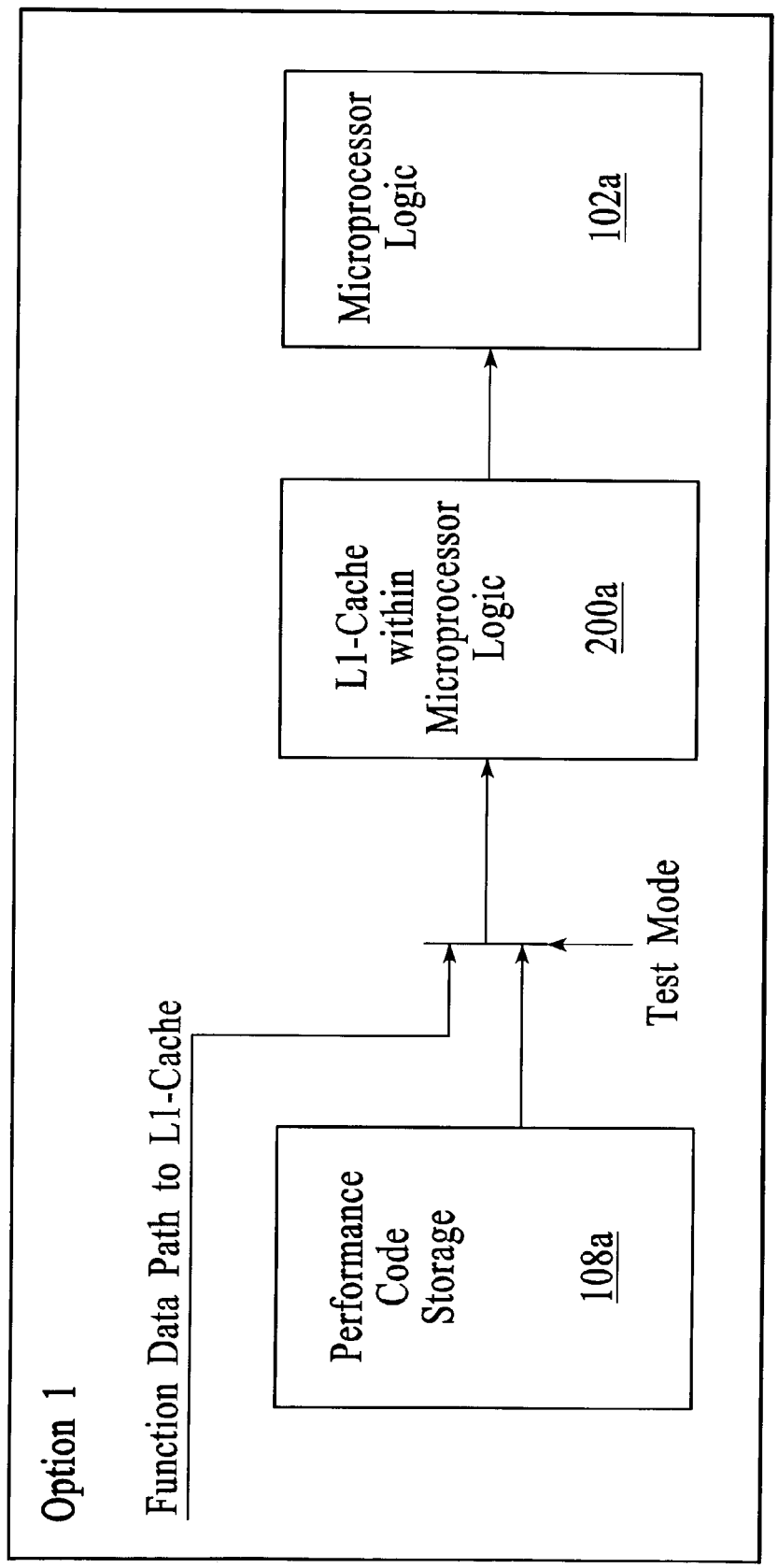
FIG. 2 illustrates a performance code storage as a separate memory serial to the L1-cache.

FIG. 2 illustrates a performance code storage 108*a* as a separate memory serial to the L1-cache 200*a*. The performance code storage 108*a* for this system can be located as a separate memory used to feed the L1-cache 200*a* and allow execution of the critical path pattern from the L1-cache 200*a* or to operate in a non-cacheable mode where the code passes through the L1-cache 200*a* controller. In this configuration, the performance code storage 108*a* is in parallel with the functional fill path of the L1-cache 200*a*. The performance code storage 108*a* and the L1-cache are integral components of the microprocessor logic.

Option 2

Figure 3:
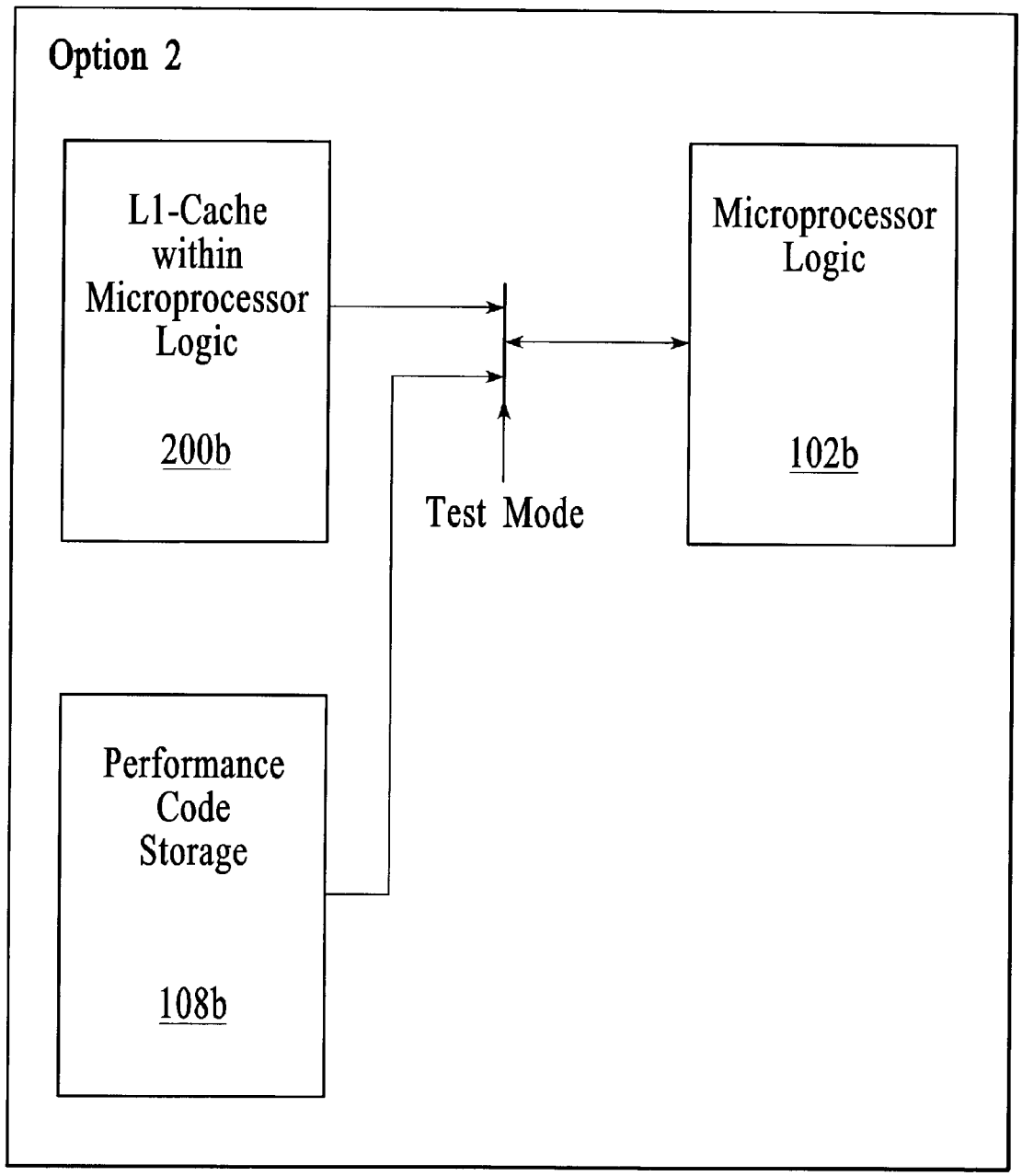
FIG. 3 illustrates a performance code storage as separate memory parallel to the L1-cache.

FIG. 3 illustrates a performance code storage 108*b* as a separate memory parallel to the L1-cache 200*b*. The performance code storage 108*b* can be located in parallel to the L1-cache 200*b*. In this case the performance code storage 108*b* is used instead of the L1-cache 200*b* when running in performance test mode. The performance code storage 108*b* and the L1-cache 200*b* are integral components of the microprocessor logic.

Option 3

Figure 4:
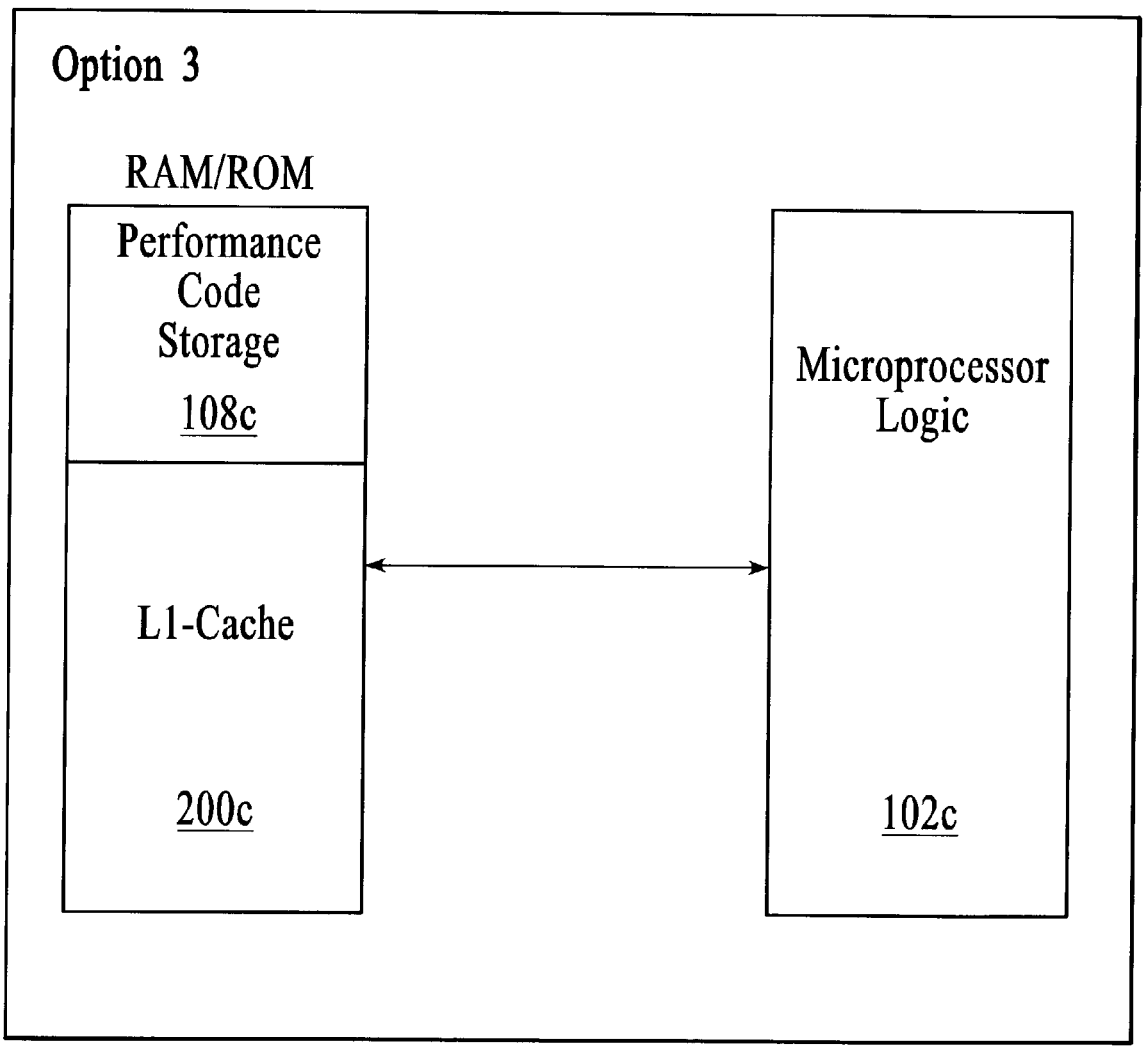
FIG. 4 illustrates the performance code storage integrated into the L1-cache.

FIG. 4 illustrates the performance code storage 108*c* integrated into the L1-cache 200*c*. In a preferred embodiment, the performance code storage 108*c* would integrate into the L1-cache 200*c*. The idea is to craft a dual-purpose L1-cache 200*c*. In this realization, the L1-cache 200*c* could be organized such that a finite number of cells, rows, words of the cache could be dedicated to the performance screening. These words of memory could be predefined with fixed values a 1a ROM that could represent the functional patterns. This RAM/ROM realization would have a minimal impact on performance. Of course, this approach would require a mask change to be able to alter the patterns and hence requires predetermination of the worst case paths. In this configuration, the L1-cache 200*c* is subdivided into RAM/ROM sections. The RAM portion of the RAM/ROM is used in normal operation as random access L1-cache 200*c*. The ROM is integrated into the L1-cache 200*c* and contains the critical path patterns. In this configuration, the access to the critical path patterns requires no additional logic paths to Support tests. The same logic paths used in functional mode are used in test mode saving area, power, and potential performance penalties of adding logic to functional paths.

PBIST System 100 Used to Maximize Performance

Referring back to FIG. 1, an adaptation of the performance analysis system used for speed binning is to use the performance analysis system as a completely self-contained test environment and to adaptively set performance. In this system, the interface to the external test environment is not used. The performance analysis test mode becomes a functional part of the microprocessor logic 102.

In this system, the signal to start testing is delivered to the BIST engine 104 from the functional operation of the device. Once the test has been started, it would continue. At the end of the test, the LPR 105 will be set and the clock manager and generator 108 would be configured to run at the maximum frequency specified by the LPR 105. The signal to start the test may be the result of detection of some environmental condition, or periodic testing generated by the microprocessor logic. The microprocessor logic 102 would be able to adaptively set its performance level based on current operating environment for maximum performance or the system may adaptively raise or lower the voltage supplied to the microprocessor logic 102 to save power while maintaining a specified performance level.

A self-monitoring system could be used to improve availability and extend system life. For example, the performance sort category has been defined at manufacturing. During actual application, the system can be put into performance test mode to set the LPR 105 with the actual in-situ performance. This can be compared to the fuse settings and appropriate action be taken. For example, if the fuse settings define the part at 500 MHz and the re-test shows lesser frequency, possibly due to environmental conditions or end-of-life effects, then an error code can be set to indicate potential failure. The system continues to run while failure analysis and problem correction is performed. If higher frequency is detected, the application may be capable of either increased speed or voltage reduction to conserve power.

PBIST System 100 Code Adaptability

Additional adaptability in critical path pattern generation can be achieved by allowing the critical path patterns to be dynamically loaded into the performance code storage. Any of the memory configurations described in options 1, 2 and 3 can be used by replacing the ROM with a RAM as the performance code storage.

Referring back again to FIG. 1, the critical path pattern can be loaded directly into the L1-cache of the microprocessor logic 102, saving the need for a special memory design. The means of loading critical path pattern can be determined by the user.

One possible mechanism for loading the performance code storage 108 RAM would be to use the BIST engine 104 as a controller with the capability to write the performance code memory. Data would be written into a register in the BIST engine 104 referred to as the BIST fill buffer (not shown). When the BIST fill buffer is full, a write operation is performed to write to the performance code memory. The BIST fill buffer can be loaded by utilizing any of the existing I/O interfaces (serial interface, general purpose I/O, etc.) on the device or a special serial interface to the BIST engine 104 that is used only in test mode. The functional cache fill buffer could be used as the BIST fill buffer by scanning data into this cache fill buffer and using the BIST engine 104 to control the write operation into the L1-cache.

Another mechanism for loading the performance code storage 108 RAM would be to use an existing JTAG controller internal to the microprocessor logic 102 to write the memory. The JTAG controller provides an interface to outside of the device. Special JTAG instruction designed to load the performance code storage 108 would be added to control the writing of the performance code storage.

SOC Integration/Portability

Figure 5:
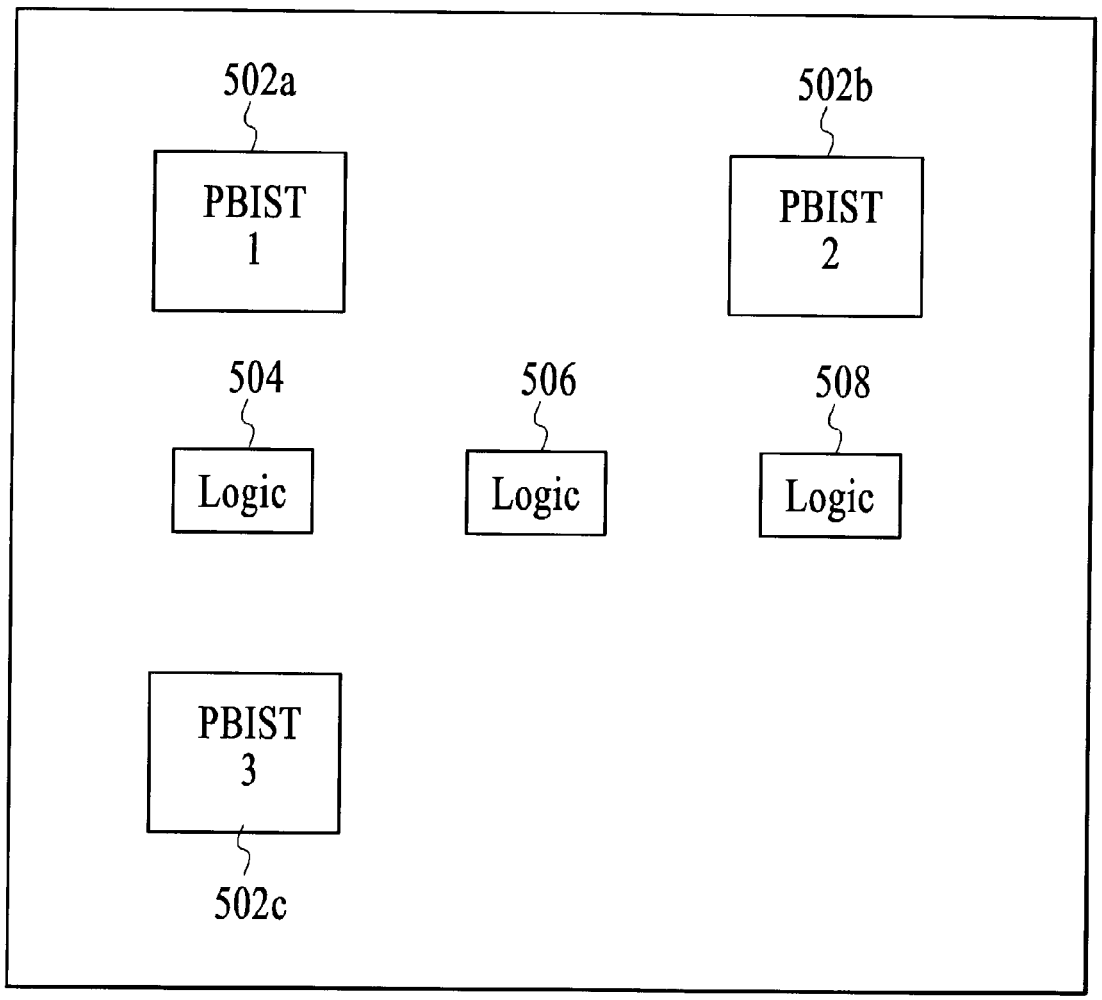
FIG. 5 is a simple block diagram of a system on a chip (SOC) configuration.

Through the use of a PBIST system in accordance with the present invention, one or more complex macros could be tested on system on a chip (SOC). FIG. 5 is a simple block diagram of a system on a chip (SOC) configuration 500. As is seen, the SOC configuration 500 includes three PBIST devices 502a–502c and three other logic functions 504–508. It should be understood by one of ordinary skill in the art that this SOC configuration 500 is an example and any number of PBIST devices and other logic functions could be utilized and their use would be within the spirit and scope of the present invention.

Accordingly, in this embodiment, each of the PBIST devices 502a–502c could be loaded with the appropriate test patterns independent of each other, as well as independent of the other logic functions 504–508. In so doing, each of the PBIST devices 502a–502c can be tested in a self-contained manner without the need for testing the other logic devices.

Advantages

A system and method in accordance with the present invention has the following advantages.

1. Accuracy: For accurate device sorting at the wafer final test or at module final test. No separate performance tester is required, as described earlier.

2. Diagnostics: Critical path code executed in the field could verify CPU performance while in the customer s application. The code could run as noted above from option 1 or scanned into the device through a JTAG port per option 2. The diagnostic would validate the system performance.

3. Adaptability: A system could be configured to monitor the LPR 105. If the system determined that environmental conditions had changed, it could then force the start of the BIST engine 104 and adjust the performance to meet the current limitations of the device. Conditions that may be the cause for an adjustment would be a single or combination of environmental factors, for example, change in voltage supply levels or change in operating temperature. Processor performance adaptability could be operator-initiated or could be initiated by conditions monitored by the system itself.

4. Extended System Life: A customer could extend the life of a system through use of the performance monitor. This would require the system to monitor the LPR 105 and, if its performance dropped below some predetermined level, an error code would be generated. The adaptability of the system to a lower performance would keep the system in operation until maintenance could be performed. An example would be EOL performance compensation. There are certain mechanisms that cause performance shifts and system failures at wear out time. One of these is HotE.

5. At-Speed Cache BIST: As technologies continue to shrink and operating voltages become smaller, current IDDQ (Quiescent Supply Current), EVS (Enhanced Voltage Stress) and DVS (Dynamic Voltage Stress) methods are losing their effectiveness to locate defects. Testing processor Icache and Dcache at speed will allow manufacturing to find AC defects. By applying the same techniques outlined above, cache memories could be tested, not just critical paths. Simple all 0s to all 1s at speed cache tests have been shown to catch AC defects that are not detectable as stuck faults using traditional ABIST (Automatic Built-in Self Test) techniques. The result is increased customer satisfaction.

6. SOC Integration/Portability

The PBIST system provides a self-contained performance tests environment targeting the microprocessor logic. The PBIST system could be employed to test one or more complex macros contained in a SOC (System On Chip) without the need to adapt the performance testing of the microprocessor logic to accommodate other logic and macros contained in the SOC. This is because the logic for the PBIST system is self-contained and does not rely on any supplemental or auxiliary logic of the SOC. This allows for reuse within multiple SOCs.

In summary, a performance sort/validate integrated custom logic device like a microprocessor core can be tested without the need for a separate, high-performance tester. A performance built-in self test (PBIST) approach provides a basic test procedure to be utilized within the device. An integrated memory array, such as the L1-cache, is provided wherein a select set of SRAM memory words are preconditioned at the time of manufacture to contain predefined functional patterns.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device comprising:
a logic function;
a self test engine coupled and integrated with the logic function; and
performance code storage coupled and integrated with the logic function, wherein the performance code storage contains a critical path pattern that will be run on the logic function to determine a performance of the logic function when the self test engine causes the logic function to be in a performance test mode, the critical path pattern being a predefined test pattern.

2. The device of claim 1, wherein the logic function automatically generates a start signal to retest the performance of the function including placing the self test engine in the performance test mode based upon a detection of change in performance of the logic function.

3. The device of claim 2, wherein the change in performance of the logic function occurs due to environmental or voltage conditions.

4. The device of claim 1, wherein the logic function comprises a microprocessor logic function.

5. The device of claim 4, wherein the logic function includes a cache.

6. The device of claim 5, wherein the cache and the performance code storage are separate and parallel to each other.

7. The device of claim 5, wherein the cache and the performance code storage are separate and are serial to each other.

8. The device of claim 5, wherein the performance code storage is integrated with the cache.

9. The device of claim 8, wherein the cache is divided into a RAM section and a ROM section, and the ROM section includes a memory word having a fixed value corresponding to the critical path pattern.

10. The device of claim 1, further comprising a clock manager and generator coupled to the logic function and the self test engine, the clock manager and generator to generate a required clock frequency to test the logic function based on a requested clock frequency received from the self test engine.

11. The device of claim 10, in which the clock manager and generator includes an integrated/on device programmable PLL which is controlled by the self test engine, the programmable PLL to output a clock frequency based on a signal from the self test engine.

12. The device of claim 1, wherein the performance code storage comprises an integrated memory array wherein a select set of memory words of the integrated memory array are preconditioned at the time of manufacture to contain predefined functional patterns that are each operable to run on the logic function to determine a performance of the logic function when the self test engine causes the logic function to be in a performance test mode.

13. The device of claim 12, wherein the integrated memory array has a dual set of word addresses and a functional mode switch to select between normal functional behavior and at speed test.

14. The device of claim 1, in which the self test engine includes a register which holds contents when a performance sort of the device is satisfied, the contents representing timing conditions associated with a fastest operational frequency tested for the logic function.

15. The device of claim 14, wherein the self test engine includes a fuse option wherein the performance of the logic function is permanently recorded.

16. The device of claim 1, wherein the self-test engine is utilized to dynamically load a critical path pattern into the performance code storage.

17. The device of claim 16, wherein the self test engine includes a fill buffer to write the dynamically loaded critical path pattern into the performance code storage.

18. The device of claim 1, wherein JTAG instructions are utilized to load a critical path pattern into the performance code storage.

19. The device of claim 1, wherein the performance of the logic function can be retested based upon a monitoring of the logic function by the self test engine.

20. The device of claim 1, wherein the device can be integrated with a system on chip (SOC).

21. The device of claim 20, wherein the device can be tested independent of any other logic on the SOC.

22. The device of claim 21, wherein the SOC includes a plurality of devices that can be tested independent of each other and any other logic on the SOC.

23. A method for sorting a device, the device including a logic function, the method comprising:
(a) storing a critical test pattern in a performance code storage that is integrated with the logic function, the critical path pattern being a predefined test pattern and operable to determine a performance of the logic function;
(b) placing the device into a test mode based upon a self test engine integrated with the device;
(c) causing the logic function to execute the critical path stored in the performance code storage; and
(d) determining test completion and status based upon the logic function and the self test engine.

24. The method of claim 23, wherein the test completion and status determining step (d) comprises:
(d1) sorting the device based upon performance; and
(d2) storing and recording the performance of the device.

25. The method of claim 24, wherein the sorting step (d1) comprises:
(d1a) requesting a clock manager and generator (CMG) within the device to be configured and start running;
(d1b) indicating a ready condition by the CMG;
(d1c) sending the ready condition to the self test engine;
(d1d) issuing another start test to the logic function;
(d1e) passing the test results from a pass/fail detection logic to a result look-up table to track the current test state; and
(d1f) repeating steps (d1a)–(d1e) until a fail condition is returned from the logic function.

26. The method of claim 25, wherein the storing and recording step (d2) further comprises:
(d2a) writing a last passing value from the result look-up table to a register after a fail condition occurs; and
(d2b) recording the last passing value within a fuse option within the self test engine.

27. A system on chip (SOC) configuration comprising:
at least one performance built-in self test (PBIST) device including, a logic function;

a self test engine coupled and integrated with the logic function; and performance code storage coupled and integrated with the logic function, wherein the performance code storage contains at least one critical path pattern that will be run on the logic function to determine the performance of the logic function when the self test engine causes the logic function to be in a performance test mode, the critical path pattern being a predefined test pattern; and at least one other logic function coupled to the PBIST device, wherein the PBIST device can be tested independently from the at least one other logic function.

28. The system of claim 27, wherein the at least one PBIST device comprises a plurality of PBIST devices, wherein each of the plurality of PBIST devices can be tested independently from each other and the at least one other logic function.

* * * * *